United States Patent
Miyazaki et al.

(10) Patent No.: US 8,956,890 B2
(45) Date of Patent: Feb. 17, 2015

(54) METHOD FOR PRODUCING GROUP III NITRIDE SEMICONDUCTOR LIGHT-EMITTING DEVICE

(71) Applicant: Toyoda Gosei Co., Ltd., Kiyosu (JP)

(72) Inventors: Atsushi Miyazaki, Kiyosu (JP); Koji Okuno, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/968,295

(22) Filed: Aug. 15, 2013

(65) Prior Publication Data

US 2014/0087508 A1 Mar. 27, 2014

(30) Foreign Application Priority Data

Sep. 21, 2012 (JP) ................................. 2012-208357

(51) Int. Cl.
| | |
|---|---|
| H01L 21/00 | (2006.01) |
| H01L 33/00 | (2010.01) |
| H01L 33/06 | (2010.01) |
| H01L 33/14 | (2010.01) |

(52) U.S. Cl.
CPC ............ *H01L 33/0075* (2013.01); *H01L 33/06* (2013.01); *H01L 33/007* (2013.01); *H01L 33/14* (2013.01)
USPC .............. 438/22; 257/E21.085; 257/E21.117; 257/E21.142; 438/45; 438/47; 438/478; 438/491

(58) Field of Classification Search
USPC .................. 257/E21.085, E21.117, E21.142; 438/22, 45, 47, 478, 491
See application file for complete search history.

(56) References Cited

U.S. PATENT DOCUMENTS

| 2008/0025360 A1* | 1/2008 | Eichler et al. ............ 372/45.012 |
| 2008/0145860 A1* | 6/2008 | Lee et al. ........................... 435/6 |

FOREIGN PATENT DOCUMENTS

| JP | 2002-198314 A | 7/2002 |
| JP | 2006-313890 A | 11/2006 |
| JP | 2009-164489 A | 7/2009 |

* cited by examiner

*Primary Examiner* — Asok K Sarkar

(74) *Attorney, Agent, or Firm* — McGinn IP Law Group, PLLC

(57) ABSTRACT

The present invention provides a method for producing a Group III nitride semiconductor light-emitting device wherein a p-cladding layer has a uniform Mg concentration. A p-cladding layer having a superlattice structure in which AlGaN and InGaN are alternately and repeatedly deposited is formed in two stages of the former process and the latter process where the supply amount of the Mg dopant gas is different. The supply amount of the Mg dopant gas in the latter process is half or less than that in the former process. The thickness of a first p-cladding layer formed in the former process is 60% or less than that of the p-cladding layer, and 160 Å or less.

20 Claims, 3 Drawing Sheets

Prior Art

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device, characterized in the method for forming a p-cladding layer.

2. Background Art

Hitherto, in the Group III nitride semiconductor light-emitting device, a p-cladding layer doped with Mg has been formed between a light-emitting layer and a p-contact layer to prevent electrons from leaking over the light-emitting layer to the side of the p-contact layer, thus electrons has been confined in the light-emitting layer.

In the crystal growth of the p-cladding layer, Mg is gradually incorporated in the crystal since the supply of raw material was started. Mg is not immediately incorporated in the crystal at a target concentration (refer to Japanese Patent Application Laid-Open (kokai) No. 2002-198314, particularly FIG. 5). When the p-cladding layer is formed at a constant supply amount of Mg dopant gas, Mg concentration distribution is formed such that the Mg concentration is low in the vicinity of the light-emitting layer side of the p-cladding layer, and gradually increases from the light-emitting layer side toward the p-contact layer side (refer to FIG. 7). Such Mg concentration distribution causes uneven carrier distribution in the p-cladding layer. The uneven carrier distribution affects the hole injection into the light-emitting layer, thereby adversely affecting the device characteristic such as light emission performance. Moreover, since the Mg concentration is high on the p-contact layer side of the p-cladding layer, crystal defects might occur due to overdoping.

A technique relating to control of Mg concentration and Mg supply amount is disclosed, for example, in Japanese Patent Application Laid-Open (kokai) Nos. 2006-313890 and 2009-164489.

Japanese Patent Application Laid-Open (kokai) No. 2006-313890 discloses that after Group III nitride semiconductor doped with Mg is grown in the atmosphere in which an amount of hydrogen is greater than that of nitrogen in the carrier gas, the supply of the Group III raw material gas is stopped, and Group III nitride semiconductor doped with Mg is regrown in the atmosphere in which an amount of nitrogen is greater than that of hydrogen in the carrier gas. It is disclosed that the Mg concentration is steeply increased in the Group III nitride semiconductor after than before regrowth.

Japanese Patent Application Laid-Open (kokai) No. 2009-164489 discloses that a low-resistance p-type superlattice structure in which AlGaN and GaN are alternately deposited, can be formed by stopping the supply of Mg raw material gas when forming AlGaN and supplying the Mg raw material gas for a shorter time than the GaN growth time when growing GaN.

As mentioned above, the conventional method for producing the p-cladding layer had a problem that the Mg concentration distribution is uneven in the p-cladding layer, thereby adversely affecting the device characteristic.

Japanese Patent Application Laid-Open (kokai) No. 2002-198314 discloses that such uneven Mg concentration distribution is formed. However, there is no description and suggestion about the method to eliminate such unevenness.

Japanese Patent Application Laid-Open (kokai) Nos. 2006-313890 and 2009-164489 do not disclose and suggest such uneven Mg concentration distribution and its elimination method.

SUMMARY OF THE INVENTION

In view of the foregoing, an object of the present invention is to eliminate unevenness of the Mg concentration distribution in the p-cladding layer, and prevent uneven carrier distribution.

The present invention is the method for producing a Group III nitride semiconductor light-emitting device having a p-cladding layer formed of Group III nitride semiconductor containing Al on a light-emitting layer, wherein the p-cladding layer is formed through a former process for forming a first p-cladding layer by MOCVD on the light-emitting layer and a latter process for forming a second p-cladding layer by MOCVD on the first p-cladding layer, and the supply amount of the Mg dopant gas in the latter process is half or less than that in the former process.

As used herein, "Group III nitride semiconductor containing Al" encompasses a semiconductor represented by the formula $Al_xGa_yIn_zN$ ($x+y+z=1$, $0<x\leq1$, $0\leq y\leq1$, $0\leq z\leq1$), e.g. AlN, AlGaN, AlInN, and AlGaInN. Specific examples of the Group III nitride semiconductor include those containing Ga, such as AlGaN or AlGaInN.

The p-cladding layer may comprise a single layer or a plurality of layers, and further have a superlattice structure. They are included in "the p-cladding layer formed of Group III nitride semiconductor containing Al" of the present invention. When the p-cladding layer comprises a plurality of layers not having a superlattice structure, at least one layer of these layers may be Group III nitride semiconductor containing Al. When the p-cladding layer has a superlattice structure, at least one layer of a plurality of layers constituting one layer unit may be formed of Group III nitride semiconductor containing Al. For example, the p-cladding layer may comprise a single layer of AlGaN or AlGaInN, or have a superlattice structure in which AlGaN and InGaN are alternately and repeatedly deposited.

As a result of that the supply amount of the Mg dopant gas in the former process is increased more than that in the latter process, Al is difficult to be incorporated in the crystal, and the Al composition ratio of the first p-cladding layer is reduced. Therefore, it is preferable to suppress the reduction of the Al composition ratio by increasing the supply amount of the Al raw material gas in the former process by 1% to 10% than that in the latter process. Moreover, the Al composition ratio of the first p-cladding layer is preferably 5 mol % to 50 mol %, and more than that of the second p-cladding layer.

As used herein, "Al composition ratio" is defined as the Al mol percent (mol %) when the mol percent of the total Group III atoms is 100 mol % in the Group III metal of the Group III nitride semiconductor. That is, 100x(%) is the Al composition ratio in the Group III nitride semiconductor represented by the formula $Al_xGa_yIn_zN$ ($x+y+z=1$, $0\leq x\leq1$, $0\leq y\leq1$, $0\leq z\leq1$).

The former process and the latter process may comprise a plurality of processes where the supply amount of the Mg dopant gas is different. In such a case, an average supply amount of the Mg dopant gas in the latter process may be half or less than that in the former process. Within a range satisfying the above conditions, the supply amount of the Mg dopant gas may be continuously or stepwise changed. For example, when the p-cladding layer has a superlattice structure in which AlGaN and InGaN are alternately and repeatedly deposited, the Mg dopant gas may be supplied when AlGaN layer and the InGaN layer are formed, or it may be supplied only when the AlGaN layer is formed to satisfy the above conditions for the supply amount of the Mg dopant gas in the former process and the latter process.

The p-cladding layer preferably has a thickness of 50 Å or more. This is because when the thickness is less than 50 Å, it cannot sufficiently serve as a cladding layer. The thickness is preferably 1000 Å or less. This is because when the thickness is larger than this, the crystallinity is deteriorated. More preferably, the p-cladding layer has a thickness of 100 Å to 500 Å.

The thickness of the first p-cladding layer preferably is 60% or less than that of the p-cladding layer, and 160 Å or less. The thickness can be such that no defects occur in the p-cladding layer by Mg doping. More preferably, the thickness of the first p-cladding layer is 50% or less than that of the p-cladding layer, and 140 Å or less.

The supply amount of the Mg dopant gas in the latter process is controlled to half or less than that in the former process to achieve such Mg concentration that no crystal defects occur in the p-cladding layer, considering Mg doping due to memory effect. The supply amount of the Mg dopant gas can be controlled, for example, by the molar partial pressure or flow rate of the Mg dopant gas. The supply amount of the Mg dopant gas in the latter process may be 0. This is because even if the supply amount is 0, the Group III nitride semiconductor is doped with Mg due to memory effect. The supply amount of the Mg dopant gas in the latter process is preferably a quarter or less than that in the former process. Also, preferably, the Mg dopant gas is supplied in the former process and the latter process so that an average Mg concentration of the overall p-cladding layer is $1 \times 10^{19}/cm^3$ to $5 \times 10^{20}/cm^3$. Such an average Mg concentration of the overall p-cladding layer does not affect the device characteristic even if the p-cladding layer is formed in two stages by changing the supply amount of the Mg dopant gas. More preferably, the Mg concentration is $1.0 \times 10^{20}/cm^3$ to $2.0 \times 10^{20}/cm^3$.

According to the present invention, uniform Mg concentration is achieved in the thickness direction of the p-cladding layer, thereby eliminating unevenness of the carrier distribution in the p-cladding layer. Thus, the bad influence, causes by the uneven carrier distribution, on the efficiency of hole injection into the light-emitting layer is reduced, and the bad effect on device characteristic such as light emission performance is reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
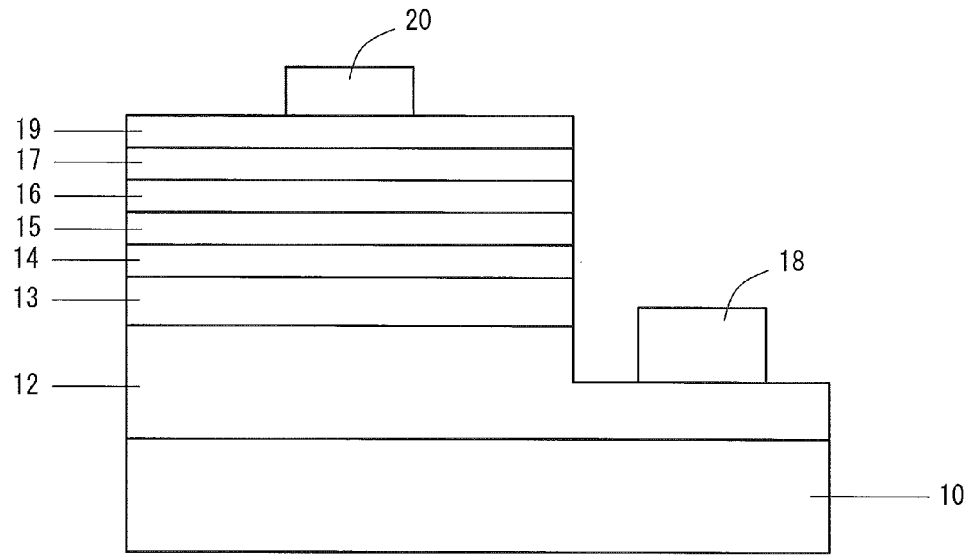
FIG. 1 shows the structure of a light-emitting device according to Embodiment 1.

FIG. 1 shows the structure of a Group III nitride semiconductor light-emitting device according to Embodiment 1.

As shown in FIG. 1, the light emitting device includes a sapphire substrate 10; and an n-contact layer 12, an nESD layer 13, an n-cladding layer 14, a light-emitting layer 15, a p-cladding layer 16, and a p-contact layer 17, which are sequentially deposited on the sapphire substrate 10 via an AlN buffer layer (not illustrated).

Moreover, a trench extending from the top surface of the p-contact layer 17 to the n-contact layer 12 is provided on a specific portion, and an n-electrode 18 is formed on the n-contact layer 12 exposed at the bottom of the trench. On the p-contact layer 17, a transparent electrode 19 of ITO (indium tin oxide) is formed, and a p-electrode 20 is formed on the transparent electrode 19. A portion except for the p-electrode 20 and the n-electrode 18 of the light-emitting device is covered with a $SiO_2$ protective film (not illustrated). This protective film is provided to prevent current leakage or short-circuit. The light-emitting device according to Embodiment 1 is of a face-up type in which a light is extracted from the surface at the p-electrode 20 side.

Next will be described in detail the structures of the light-emitting device according to Embodiment 1.

The sapphire substrate 10 has concaves and convexes (not illustrated) formed in a periodic pattern such as stripes or dots on the surface at the side where Group III nitride semiconductor is crystal grown. These concave and convexes are formed to improve the light extraction performance. The growth substrate may be formed of, for example, SiC, Si, ZnO, spinel, GaN or $Ga_2O_3$ other than sapphire.

The n-contact layer 12 is formed of n-GaN having a Si concentration of $1 \times 10^{18}/cm^3$ or more. The n-contact layer 12 may comprise a plurality of layers having different Si concentrations. When some of the layers have higher Si concentration and are in-contact with the n-electrode 18, the contact resistance of the n-electrode 18 can be further reduced without deteriorating the crystallinity of the n-contact layer 12.

The nESD layer 13 has a three-layer structure of a first ESD layer, a second ESD layer, and a third ESD layer which are deposited in this order on the n-contact layer 12. The first ESD layer has pits (pit density: $1 \times 10^8/cm^2$ or less) on the surface at the light-emitting layer 15 side thereof. The first ESD layer is formed of GaN having a thickness of 200 nm to 1000 nm and a Si concentration of $1 \times 10^{16}/cm^3$ to $5 \times 10^{17}/cm^3$. The second ESD layer has pits (pit density: $2 \times 10^8/cm^2$ or more) on the surface at the light-emitting layer 15 side thereof. The second ESD layer is formed of GaN having a thickness of 50 nm to 200 nm and a carrier concentration of $5 \times 10^{17}/cm^3$ or less. The third ESD layer is formed of GaN having a characteristic value, as defined by the product of Si concentration ($/cm^3$) and thickness (nm), of $0.9 \times 10^{20}$ to $3.6 \times 10^{20}$ ($nm/cm^3$). Such a structure of the SD layer can improve electrostatic breakdown voltage, emission performance, and reliability, and reduce the current leakage.

The n-cladding layer 14 has a superlattice structure in which a plurality of layer units are repeatedly deposited, each layer unit having a three-layer structure of undoped InGaN, undoped GaN, and n-GaN deposited in this order.

The light-emitting layer 15 has a MQW structure in which a plurality of layer units are repeatedly deposited, each layer unit including an InGaN well layer, a GaN capping layer, and an AlGaN barrier layer sequentially deposited. The capping layer is formed at the same temperature as employed for the well layer to prevent In from evaporating from the well layer during heating for formation of the barrier layer. Layers comprising undoped GaN and undoped AlGaN may be formed between the light-emitting layer 15 and the p-cladding layer 16 to prevent Mg from diffusing from the p-cladding layer 16 to the light-emitting layer 15.

Figure 2:
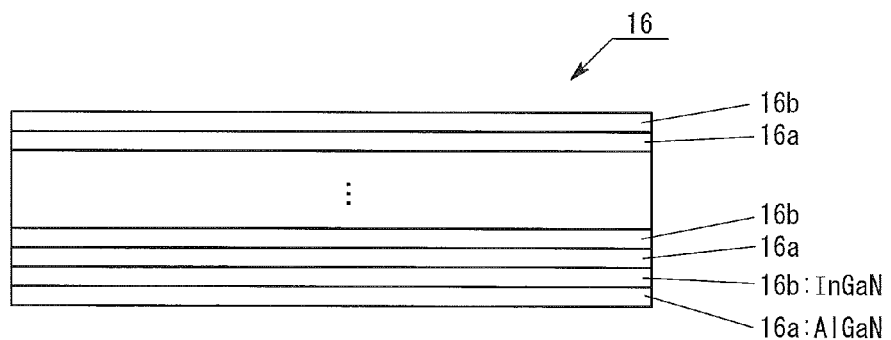
FIG. 2 shows the structure of a p-cladding layer 16.

The p-cladding layer 16 has a superlattice structure in which a plurality of layer units are repeatedly deposited, each layer unit including two layers of a AlGaN layer 16a and an InGaN layer 16b which are sequentially deposited (refer to FIG. 2). The In composition ratio of InGaN to the number of moles of the total Group III atoms is more than 0 mol % and 10 mol % or less. The Al composition ratio of AlGaN to the number of moles of the total Group III atoms is more than 0 mol % and 100 mol % or less. The p-cladding layer 16 has a thickness of 50 Å to 1000 Å. When the thickness is smaller than 50 Å, it cannot sufficiently serve as a cladding layer (function to confine carriers into the light-emitting layer to improve the light emission performance), which is not preferable. When the thickness is larger than 1000 Å, the crystallinity is deteriorated, which is not preferable. The p-cladding layer 16 has a uniform Mg concentration distribution in the thickness direction of the p-cladding layer 16 through the forming method described later. The overall p-cladding layer 16 has an average Mg concentration of $1 \times 10^{19}/cm^3$ to $5 \times 10^{20}/cm^3$.

The p-cladding layer 16 does not necessarily have a superlattice structure, and may comprise a plurality of layers or a single layer, e.g. a single layer of Mg-doped AlGaN. In the case of the above superlattice structure, each layer unit may include two layers of AlGaN and GaN or three layers of AlGaN, GaN, and InGaN other than two layers of AlGaN and InGaN.

Figure 3:
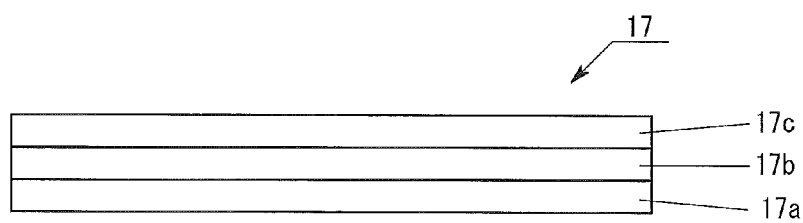
FIG. 3 shows the structure of a p-contact layer 17.

As shown in FIG. 3, the p-contact layer 17 has a three-layer structure of a first p-contact layer 17a, a second p-contact layer 17b, and a third p-contact layer 17c which are sequentially deposited on the p-cladding layer 16. The first p-contact layer 17a is formed of p-GaN, and has a thickness of 295 Å to 355 Å and a Mg concentration of $1.0 \times 10^{19}/cm^3$ to $3.0 \times 10^{19}/cm^3$. The second p-contact layer 17b is formed of p-GaN, and has a thickness of 290 Å to 350 Å and a Mg concentration of $7.0 \times 10^{19}/cm^3$ to $2.0 \times 10^{20}/cm^3$. The third p-contact layer 17c is formed of p-GaN, and has a thickness of 50 Å to 110 Å and a Mg concentration of $7.0 \times 10^{19}/cm^3$ to $2.0 \times 10^{20}/cm^3$. Such a structure of the p-contact layer 17 can reduce simultaneously the contact resistance and the drive voltage.

The structure of the p-contact layer 17 is not limited to the above structure, any conventionally known structure e.g. a single layer may be employed. In the case of a plurality of layers, the composition ratio may be changed. The first p-contact layer 17a may be formed by supplying the Mg dopant gas or may be formed by spontaneously doping with Mg due to memory effect without supplying the Mg dopant gas.

The transparent electrode 19 made of ITO is formed on almost the entire surface of the p contact layer 17. The transparent electrode 19A may be formed, for example, of a transparent oxide conductive material such as ICO (cerium-doped indium oxide), IZO (zinc-doped indium oxide), ZnO, $TiO_2$, $NbTiO_2$, $TaTiO_2$ other than ITO, a metal thin film such as Co/Au, Au or graphene.

The n-electrode 18 and the p-electrode 20 may have a structure including a pad to which a wire is bonded, and a wiring pattern extending (e.g. in a grid-like pattern, a comb teeth pattern, or a radial pattern) on each surface of the n-contact layer 12 and the transparent electrode 19, which is connected to the pad. Such a structure can improve the current diffusion, thereby obtaining a uniform light emission.

Next will be described processes for producing the light-emitting device according to Embodiment 1 with reference to FIGS. 4A to 4C.

Figure 4A:
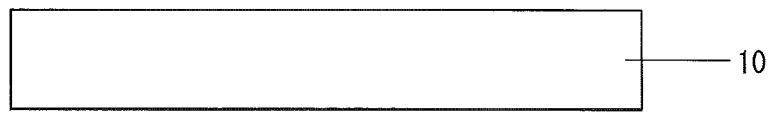
FIGS. 4A to 4C are sketches showing processes for producing the light-emitting device according to Embodiment 1.

Firstly, a sapphire substrate 10 having concaves and convexes thereon is prepared, and heated in a hydrogen atmosphere for cleaning of the surface (FIG. 4A).

Figure 4B:
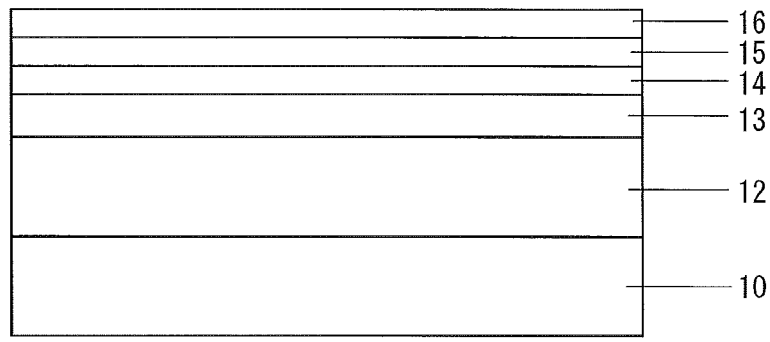
Figure 4C:
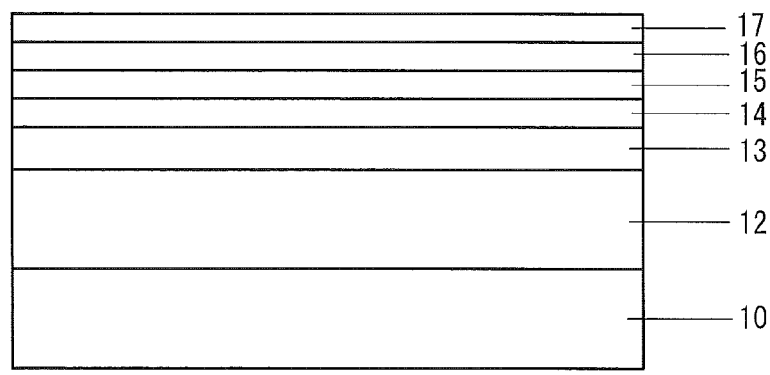

Subsequently, on the sapphire substrate 10, by atmospheric pressure MOCVD, an AlN buffer layer (not illustrated), an n-contact layer 12, an nESD layer 13, an n-cladding layer 14, a light-emitting layer 15, and a p-cladding layer 16 are sequentially deposited (FIG. 4B). The raw material gases employed in MOCVD are as follows: ammonia gas ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as a Si dopant gas; cyclopentadienylmagnesium ($Mg(C_5H_5)_2$) as a Mg dopant gas; and hydrogen ($H_2$) and nitrogen ($N_2$) as a carrier gas.

Here, the p-cladding layer 16 is formed in two stages of the former process and the latter process as explained with reference to FIGS. 5A and 5B below.

[Former Process]

Figure 5A:
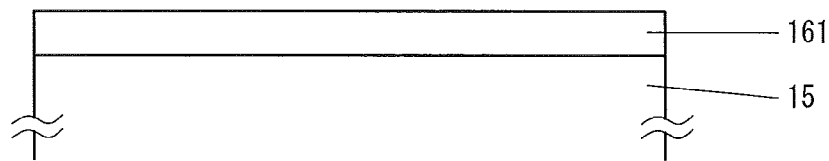
FIGS. 5A and 5B are sketches showing processes for forming the p-cladding layer 16.

Firstly, a first p-cladding layer 161 is formed on the light-emitting layer 15 by atmospheric pressure MOCVD (FIG. 5A). Of the first p-cladding layer 161, an AlGaN layer 16a is formed at a temperature of 800° C. to 950° C., and an InGaN layer 16b is formed at a temperature of 800° C. to 950° C. The first p-cladding layer 161 is formed so as to have a thickness of 160 Å or less, preferably, 140 Å or less.

[Latter Process]

Figure 5B:
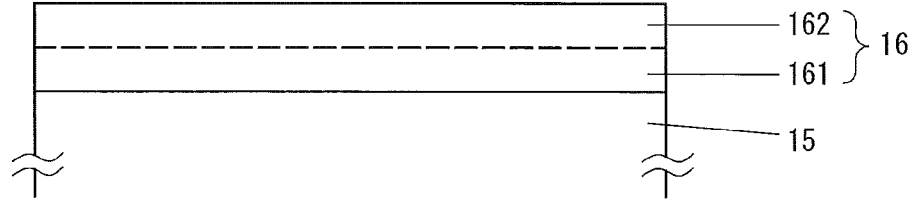

Subsequently, a second p-cladding layer 162 is formed on the first p-cladding layer 161 by atmospheric pressure MOCVD (FIG. 5B). Thus, a p-cladding layer 16 comprising the first p-cladding layer 161 and the second p-cladding layer 162 is formed. The growth temperature is the same as when the first p-cladding layer 161 was formed. Here, the molar partial pressure of the Mg dopant gas when forming the second p-cladding layer 162 is controlled to half or less than that when forming the first p-cladding layer 161. Controlling the supply amount of the Mg dopant gas in this way can achieve such Mg concentration that no crystal defects occur in the p-cladding layer, considering Mg doping due to memory effect. More preferably, the molar partial pressure of the Mg dopant gas when forming the second p-cladding layer 162 is a quarter or less than that when forming the first p-cladding layer 161. Also, preferably, the supply amount of the Mg dopant gas is controlled in the former process and the latter process so that an average Mg concentration of the overall p-cladding layer 16 is $1 \times 10^{19}/cm^3$ to $5 \times 10^{20}/cm^3$.

The second p-cladding layer 162 is formed so as to have a thickness of 40% or more than that of the overall p-cladding layer 16. That is, the first p-cladding layer 161 has a 60% or less thickness, preferably, 50% or less than that of the overall p-cladding layer 16. The first p-cladding layer 161 is formed so as to have a thickness of 160 Å or less, and 60% or less than that of the p-cladding layer, thereby obtaining a thickness that no crystal defects occur in the p-cladding layer 16 by Mg doping. The total thickness of the first p-cladding layer 161 and the second p-cladding layer 162, i.e. the overall thickness of the p-cladding layer 16 is 50 Å to 1000 Å.

In the former process and the latter process mentioned above, the supply amount of the Mg dopant gas is controlled by the molar partial pressure of the Mg dopant gas. However, it may be controlled by the flow rate of the Mg dopant gas. Although the growth temperature may be different between the former process and the latter process, it is preferably the same in terms of simplification of the production process.

When forming the p-cladding layer 16, the Mg dopant gas is supplied in the former process and the latter process mentioned above when forming the AlGaN layer 16a and the InGaN layer 16b of the p-cladding layer 16. However, the Mg dopant gas may be supplied only when forming the AlGaN layer 16a. In the former process the Mg dopant gas may be supplied when forming the AlGaN layer 16a and the InGaN layer 16b, and in the latter process the Mg dopant gas may be supplied only when forming the AlGaN layer 16a. Alternatively in the former process the Mg dopant gas may be supplied only when forming the AlGaN layer 16a, and in the latter process the Mg dopant gas may be supplied when forming the AlGaN layer 16a and the InGaN layer 16b. An average supply amount of the Mg dopant gas when forming a layer unit of AlGaN layer 16a and InGaN layer 16b in the latter process should be half or less than that when forming a layer unit of AlGaN layer 16a and InGaN layer 16b in the former process.

When the p-cladding layer 16 is formed through the above two-stage process, the Mg concentration of the overall p-cladding layer can be more uniform than when the p-cladding layer is formed at a constant supply amount of the Mg dopant gas. Therefore, unevenness of the carrier distribution in the p-cladding layer 16 is eliminated, the affection of the uneven carrier distribution on hole injection into the light-emitting layer 15 is reduced, and the impact on the device characteristic such as light emission performance is reduced.

Next, a first p-contact layer 17a, a second p-contact layer 17b, and a third p-contact layer 173 are sequentially deposited by MOCVD to form a p-contact layer 17 on the p-cladding layer 16. Here, the first p-contact layer 17a may be formed without supplying the Mg dopant gas because Mg is doped due to memory effect even if the Mg dopant gas is not supplied.

Subsequently, a trench having a depth extending from the top surface of the p-contact layer 17 to the n-contact layer 12 is formed by dry etching a specific portion. The transparent electrode 19 made of ITO is formed on almost the entire surface of the p contact layer 17, a p-electrode 20 is formed on the transparent electrode 19, and an n-electrode 18 is formed on the surface of the n-contact layer 12 exposed at the bottom of the trench. Through the above, the Group III nitride semiconductor light-emitting device according to Embodiment 1 as shown in FIG. 1 is produced.

Figure 6:
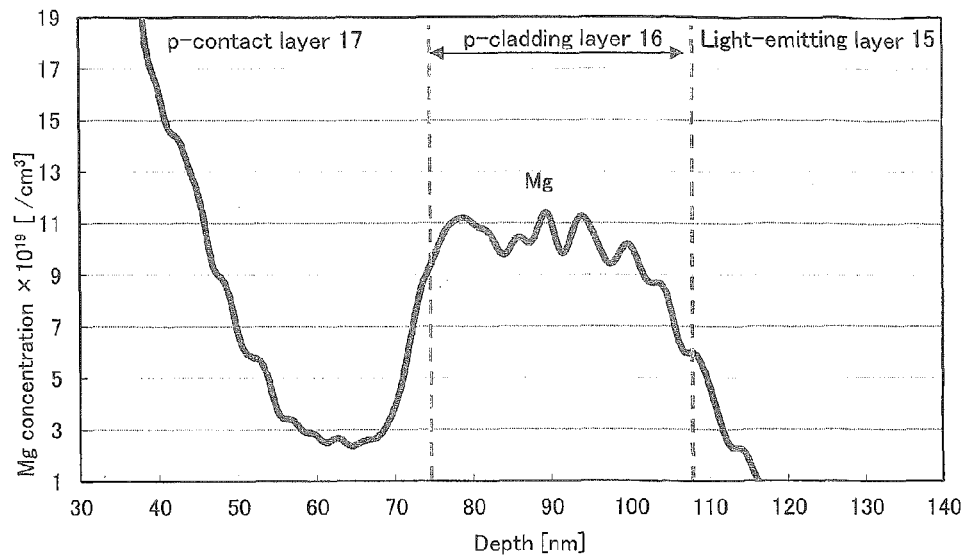
FIG. 6 is a graph showing the Mg concentration profile in the forming method according to Embodiment 1.

FIG. 6 is a graph showing the Mg profile in the thickness direction of the light-emitting device according to Embodiment 1, which was measured by GDS (Glow Discharge Spectrometer). The horizontal axis shows the depth from the top surface of the p-contact layer 17, and the vertical axis shows the Mg concentration. These depth and Mg concentration are values converted from the sputtering time and the detection voltage, respectively, measured by the GDS. As is clear from FIG. 6, after the Mg concentration steeply increases from the vicinity of the interface between the light-emitting layer 15 and the p-cladding layer 16 toward the p-contact layer 17, the Mg concentration is kept almost constant, and then the Mg concentration steeply decreases in the vicinity of the interface between the p-cladding layer 16 and the p-contact layer 17.

Figure 7:
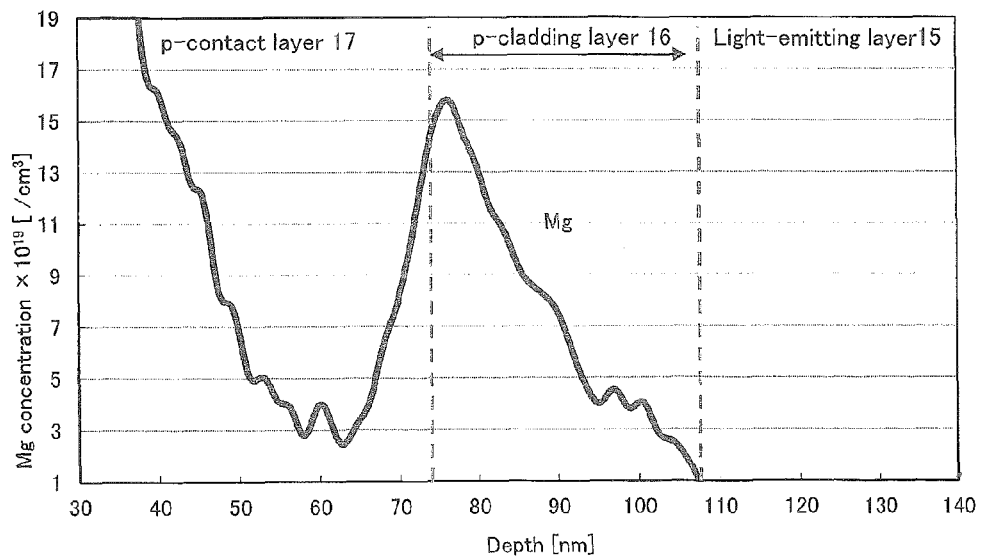
FIG. 7 is a graph showing the Mg concentration profile according to the conventional forming method.

On the contrary, in the conventional light-emitting device in which the p-cladding layer was formed at a constant supply amount of Mg dopant gas, as is clear from FIG. 7, the Mg concentration slowly increases from the vicinity of the interface between the light-emitting layer 15 and the p-cladding layer 16 toward the p-contact layer 17, and the Mg concentration steeply decreases in the vicinity of the interface between the p-cladding layer 16 and the p-contact layer 17.

From comparison between FIG. 6 and FIG. 7, it is found that the Mg concentration distribution in the thickness direction of the p-cladding layer 16 can be more uniform than ever before by the method for forming the p-cladding layer 16 described in Embodiment 1.

Embodiment 2

In Embodiment 2, the supply amount of the Al raw material gas is changed as follows in the method for forming the p-cladding layer 16 according to Embodiment 1. Others are the same as in Embodiment 1.

The supply amount of the Al raw material gas in the former process to form the p-cladding layer 16, i.e. the process for forming the first p-cladding layer 161 is increased by 1% to 10% more than that in the latter process, i.e. the process forming the second p-cladding layer 162. Thus, the Al composition ratio of the AlGaN layer 16a in the first p-cladding layer 161 is 5 mol % to 50 mol %, and more than the Al composition ratio of the AlGaN layer 16a in the second p-cladding layer 162 by controlling the supply amount of the Al raw material gas.

As a result of that the supply amount of the Mg dopant gas in the former process is increased more than that in the latter process in the method for forming the p-cladding layer 16 according to Embodiment 1, Al is difficult to be incorporated in the crystal, and the Al composition ratio of the AlGaN layer 16a is reduced in the first p-cladding layer 161. Therefore, the reduction of the Al composition ratio due to increase in the supply amount of the Mg dopant gas is suppressed by controlling the supply amount of the Al raw material gas and Al composition ratio of the crystal as mentioned above.

Embodiments 1 and 2 show the cases when the p-cladding layer is formed in two different stages where the supply amount of the Mg dopant gas is different. However, the present invention is not limited to such two-stage process, when the first multiple stages are defined as the former process, and the following multiple stages are defined as the latter process, any number of stages may be set as long as an average supply amount of the Mg dopant gas in the latter process is half or less than that in the former process. Moreover, as long as the average supply amounts in the two processes satisfies the above conditions, the supply amount of the Mg dopant gas may be continuously changed in the growth of the p-cladding layer.

The Group III nitride semiconductor light-emitting device of the present invention can be employed in, for example, an illumination apparatus or a display apparatus.

What is claimed is:

1. A method for producing a Group III nitride semiconductor light-emitting device including a p-cladding layer comprising a Group III nitride semiconductor containing Al on a light-emitting layer,
   wherein the p-cladding layer is formed in a former process where a first p-cladding layer is formed by metalorganic chemical vapor deposition (MOCVD) on the light-emitting layer, and in a latter process where a second p-cladding layer is formed by MOCVD on the first cladding layer, and
   wherein a supply amount of a Mg dopant gas in the latter process is half or less than a supply amount of Mg dopant gas in the former process such that a Mg concentration distribution is obtained in which after the Mg concentration steeply increases from a vicinity of an interface between the light-emitting layer and the p-cladding layer toward a p-contact layer, the Mg concentration is kept almost constant, and then the Mg concentration steeply decreases in a vicinity of the interface between the p-cladding layer and the p-contact layer.

2. The method for producing the Group III nitride semiconductor light-emitting device according to claim 1, wherein a supply amount of Al raw material gas in the former process is increased by 1% to 10% more than a supply amount of Al raw material gas in the latter process.

3. The method for producing the Group III nitride semiconductor light-emitting device according to claim 2, wherein a thickness of the first p-cladding layer is 60% or less than a thickness of the second p-cladding layer, and 160 Å or less.

4. The method for producing the Group III nitride semiconductor light-emitting device according to claim 3, wherein an Al composition ratio of the first p-cladding layer is 5 mol % to 50 mol %, and more than an Al composition ratio of the second p-cladding layer.

5. The method for producing the Group III nitride semiconductor light-emitting device according to claim 3, wherein an average Mg concentration of the p-cladding layer is in a range from $1 \times 10^{19}/cm^3$ to $5 \times 10^{20}/cm^3$.

6. The method for producing the Group III nitride semiconductor light-emitting device according to claim 2, wherein the p-cladding layer has a thickness of 50 Å or more.

7. The method for producing the Group III nitride semiconductor light-emitting device according to claim 2, wherein an Al composition ratio of the first p-cladding layer is 5 mol % to 50 mol %, and more than an Al composition ratio of the second p-cladding layer.

8. The method for producing the Group III nitride semiconductor light-emitting device according to claim 7, wherein the Mg dopant gas is supplied in the former process and the latter process so that an average Mg concentration of the p-cladding layer is $1 \times 10^{19}/cm^3$ to $5 \times 10^{20}/cm^3$.

9. The method for producing the Group III nitride semiconductor light-emitting device according to claim 2, wherein the Mg dopant gas is supplied in the former process and the latter process so that an average Mg concentration of the p-cladding layer is $1 \times 10^{19}/cm^3$ to $5 \times 10^{20}/cm^3$.

10. A method for producing a Group III nitride semiconductor light-emitting device according to claim 2, wherein the p-cladding layer includes a superlattice structure in which InGaN and AlGaN are alternately and repeatedly deposited.

11. The method for producing the Group III nitride semiconductor light-emitting device according to claim 2, wherein an average Mg concentration of the p-cladding layer is in a range from $1 \times 10^{19}/cm^3$ to $5 \times 10^{20}/cm^3$.

12. The method for producing the Group III nitride semiconductor light-emitting device according to claim 1, wherein a thickness of the first p-cladding layer is 60% or less than a thickness of the second p-cladding layer, and 160 Å or less.

13. The method for producing the Group III nitride semiconductor light-emitting device according to claim 12, wherein an Al composition ratio of the first p-cladding layer is 5 mol % to 50 mol %, and more than an Al composition ratio of the second p-cladding layer.

14. The method for producing the Group III nitride semiconductor light-emitting device according to claim 12, wherein an average Mg concentration of the p-cladding layer is in a range from $1 \times 10^{19}/cm^3$ to $5 \times 10^{20}/cm^3$.

15. The method for producing the Group III nitride semiconductor light-emitting device according to claim 1, wherein the p-cladding layer has a thickness of 50 Å or more.

16. The method for producing the Group III nitride semiconductor light-emitting device according to claim 1, wherein an Al composition ratio of the first p-cladding layer is 5 mol % to 50 mol %, and more than an Al composition ratio of the second p-cladding layer.

17. The method for producing the Group III nitride semiconductor light-emitting device according to claim 16, wherein the Mg dopant gas is supplied in the former process and the latter process so that an average Mg concentration of the p-cladding layer is $1 \times 10^{19}/cm^3$ to $5 \times 10^{20}/cm^3$.

18. The method for producing the Group III nitride semiconductor light-emitting device according to claim 1, wherein the Mg dopant gas is supplied in the former process and the latter process so that an average Mg concentration of the p-cladding layer is $1 \times 10^{19}/cm^3$ to $5 \times 10^{20}/cm^3$.

19. A method for producing a Group III nitride semiconductor light-emitting device according to claim 1, wherein the p-cladding layer includes a superlattice structure in which InGaN and AlGaN are alternately and repeatedly deposited.

20. The method for producing the Group III nitride semiconductor light-emitting device according to claim 1, wherein an average Mg concentration of the p-cladding layer is in a range from $1 \times 10^{19}/cm^3$ to $5 \times 10^{20}/cm^3$.

* * * * *